(12) United States Patent
Keim et al.

(10) Patent No.: US 7,178,071 B2
(45) Date of Patent: Feb. 13, 2007

(54) DEVICE FOR AND METHOD OF EXAMINING THE SIGNAL PERFORMANCE OF SEMICONDUCTOR CIRCUITS

(75) Inventors: Martin Keim, Olching (DE); Michael Kund, Tuntenhausen (DE)

(73) Assignee: Infineon Technologies AG, Munich (DE)

( * ) Notice: Subject to any disclaimer, the term of this patent is extended or adjusted under 35 U.S.C. 154(b) by 857 days.

(21) Appl. No.: 10/164,770

(22) Filed: Jun. 7, 2002

(65) Prior Publication Data

US 2003/0030071 A1 Feb. 13, 2003

(30) Foreign Application Priority Data

Jun. 7, 2001 (DE) .................. 101 27 656

(51) Int. Cl.
*G11B 20/20* (2006.01)
*G01R 31/28* (2006.01)

(52) U.S. Cl. ..................................... 714/700

(58) Field of Classification Search ............... 714/700, 714/744

See application file for complete search history.

(56) References Cited

U.S. PATENT DOCUMENTS

| 4,058,767 | A | | 11/1977 | Muehldorf et al. |
| 5,231,598 | A | * | 7/1993 | Vlahos ..................... 714/700 |
| 6,105,157 | A | * | 8/2000 | Miller ...................... 714/744 |
| 6,369,601 | B1 | * | 4/2002 | Ishigaki .................... 324/765 |

OTHER PUBLICATIONS

Schrüfer, E.: "Elektrische Messtechnik" [Electric Measurement Technique], Carl Hanser Verlag München, 1983, pp. 313-315.

* cited by examiner

*Primary Examiner*—Shelly Chase
(74) *Attorney, Agent, or Firm*—Laurence A. Greenberg; Werner H. Stemer; Ralph E. Locher

(57) ABSTRACT

A device and method for detecting a delay time of a circuit is provided. A test signal is fed into the circuit, the test signal including a signal edge, the occurrence of which is related to a reference time. The output signal of the circuit is sampled at predetermined times to obtain a sequence of sample values, with a first state being associated with a sample value when the output signal has a first signal value and a second state being associated with a sample value when the output signal has a second signal value. A counter counts the sample values of the sequence, to which an equal state is associated, to obtain counted sample values. A delay time is calculated using the counted number of sample values.

36 Claims, 3 Drawing Sheets

DEVICE FOR AND METHOD OF EXAMINING THE SIGNAL PERFORMANCE OF SEMICONDUCTOR CIRCUITS

FIELD OF THE INVENTION

The present invention relates to a device for and a method of detecting the delay times of semiconductor circuits and especially to the detection of the delay times of semiconductor circuits by means of a semiconductor tester.

BACKGROUND OF THE INVENTION AND PRIOR ART

In the field of integrated semiconductor circuits the ever-smaller minimal structural dimensions of the respective circuit elements pose ever-higher demands on the production processes of integrated semiconductor circuits. To the same extent the demands on the so-called chip performance also increase. For this reason it is tried to already take account of process variations unavoidable in practice, if possible, in the circuit simulation of the integrated semiconductor circuit. This results in interval regions for the chip performance, within which the chip performance should typically be. With this modified circuit simulations, however, the velocity variations of the integrated semiconductor circuits, really occurring during the production of same, due to process variations naturally cannot be predicted exactly. Thus it is typically required that, when, on the one hand, large intervals for the respective chip performance are present and, on the other hand, high customer demands are posed on the integrated semiconductor circuits, each semiconductor circuit, i.e. each individual chip, would have to be subjected to a test for examining the chip performance.

In practice, however, the performance, i.e. the velocity or the signal delay, respectively, of the integrated semiconductor circuits produced is manually examined at a few selected semiconductor circuits. This manual examination, however, on the one hand requires lots of personnel and on the other hand, as expected, does not cover the entire process window, i.e. the predetermined velocity interval.

In addition the personnel required for the examination of the chip performance contributes considerably to the production cost of semiconductor circuits. Since, as has been mentioned above, only a certain selection of the semiconductor circuits produced is examined, no final and comprehensive statements about the chip performance of all the integrated semiconductor circuits produced can be made.

SUMMARY OF THE INVENTION

It is the object of the present invention to provide an improved concept for examining the signal performance of a circuit.

In accordance with a first aspect of the present invention, this object is achieved by a device for detecting a delay time of a circuit, comprising: a feeder for feeding a test signal into said circuit, said signal comprising a signal edge, the occurrence of which is related to a reference time; a sampler for sampling an output signal of said circuit at predetermined times to obtain a sequence of sample values, a first state being associated to a sample value when said output signal has a first signal value and a second state being associated to a sample value when said output signal has a second signal value; a counter for counting said sample values of said sequence, to which an equal state is associated, starting from said reference time or from another reference time, the time interval of which to said reference time being known, to obtain a counted number of sample values; and a calculator for calculating said delay time using the counted number of sample values and said reference time.

In accordance with a second aspect of the present invention, this object is achieved by a method of detecting a delay time of a circuit, comprising: feeding a test signal into the circuit, said signal comprising a signal edge, the occurrence of which is related to a reference time; sampling an output signal of said circuit at predetermined times to obtain a sequence of sample values, a first state being associated to a sample value when said output signal has a first signal value and a second state being associated to a sample value when said output signal has a second signal value; counting the sample values of the sequence, to which an equal state is associated, starting from said reference time or from another reference time, the time interval of which to the reference time being known, to obtain a counted number of sample values; and calculating said delay time using the counted number of sample values and said reference time.

In accordance with a third aspect of the present invention, this object is achieved by a device for determining a variation of the length of an input test pulse by a circuit under test, comprising: a feeder for feeding said input test signal into said circuit, said test signal comprising at least a first and a second test signal edge, said first and second test signal edges defining the predetermined length of an input test pulse of said input test signal; a sampler for sampling an output signal of said circuit, said signal comprising a first and a second output signal edge, said first and second output signal edges of said output signal defining the length of an output pulse of said output signal as a response to said input test pulse of said test signal, the sampling occurring at predetermined times to obtain a sequence of sample values, a first state being associated to a sample value when said output signal has a first signal value and a second state being associated to a sample value when said output signal has a second signal value; a counter for counting said sample values to which an equal state is associated to obtain a counted number of sample values; a calculator for calculating the length of said output pulse of said output signal of said circuit using the counted number of sample values.

In accordance with a first aspect of the present invention, this object is achieved by a method for determining a variation of the length of an input test pulse by a circuit under test, comprising: feeding said input test signal into said circuit, said test signal comprising at least a first and a second test signal edge, said first and second test signal edges defining the predetermined length of an input test pulse of said input test signal; sampling an output signal of said circuit, said signal comprising a first and a second output signal edge, said first and second output signal edges of said output signal defining the length of an output pulse of said output signal as a response to said input test pulse of said test signal, the sampling occurring at predetermined times to obtain a sequence of sample values, a first state being associated to a sample value when said output signal has a first signal value and a second state being associated to a sample value when said output signal has a second signal value; counting said sample values to which an equal state is associated to obtain a counted number of sample values; and calculating the length of said output pulse of said output signal of said circuit using the counted number of sample values.

One aspect of the present invention for detecting a delay time of a circuit includes feeding a test signal into the circuit, the test signal comprising a signal edge, the occurrence of which is related to a reference time. An output signal of the circuit is then sampled at a predetermined time to obtain a sequence of sample values, a first state being associated to a sample value when the output signal has a first signal value and a second being associated to a sample value when the output signal has a second signal value. The sample values of the sequence, to which an equal state is associated, are then counted starting from the reference time or from a further reference time, the time interval ("time distance") of which to the given reference time is known, to obtain a counted number of sample values. Using the counted number of sample values and the reference time, the delay time of the circuit is then calculated.

By means of the present invention the delay time of a circuit between the input signal and the output signal related thereto and thus the velocity of the circuit can be determined by sampling this delay time using the sample or strobe signal at predetermined times. The predetermined times can thus occur in a predefined periodic or also in a non-periodic interval.

Thus a sequence of sample values defining the respective state (the signal value) of the output signal and being associated to a respective predetermined partial duration which can differ from one sample value to the next is obtained. From this sequence of sample values the demanded delay time between the input signal and the output signal of the circuit under test (circuit to be examined) can be determined by simply "counting" the sample values present until the occurrence of a first signal edge of the output signal using the respective time interval of the sample signals.

Thus it is especially advantageous that in the present invention a so-called semiconductor tester, such as a logic tester or a memory tester, provided for a functional test of integrated semiconductor circuits can be used. In a memory tester, for example, the determined functional state of the memory element under test is typically mapped one to one in the test or error memory, respectively, of the memory tester, i.e. a 1-1 map of the memory element examined is mapped in the error memory of the memory tester.

For determining the delay time of the circuit, in the present invention, the sequence of sample values of the output signal, obtained by sampling, is filed as a sequence of so-called fail and pass information (F and P information) in the error memory of the semiconductor tester. The result is a sequence of F and P information in the error memory, which, depending on the frequency of the sample signal, represents the circuit-internal delay of the signal. Thus the internal signal delay time of the circuit and thus the velocity of the integrated semiconductor circuit examined can be determined by simply counting the F and P information in the error memory and using the known time intervals between the sampling times and a reference time.

The present invention further makes it possible that the determination of the internal delay time of a circuit and thus the velocity of same can be performed automatically. This is not only a considerable time saving with a great number of circuits to be examined but also in the case of a characterization of an individual chip.

In contrast to a manual examination of the performance of the integrated circuits produced, this examination being usually performed only at a few selected integrated semiconductor circuits, the personnel required can be reduced considerably with the present invention. Thus the production cost for the integrated semiconductor circuit can also be reduced considerably.

A further advantage of the present invention is that data on the distribution of the internal delay time and thus on the velocity of a plurality of integrated semiconductor circuits are automatically acquired, wherein these data can for example be evaluated statistically so that statements an process variations and their effects on the electric performance of the integrated semiconductor circuit produced can be made therefrom.

With the help of the data acquired the existing circuit simulation models can be refined, i.e. the velocity variations due to technical process variations can be predicted more precisely for the future and thus be better included in the circuit simulation.

A further advantage of the present invention is that an exact determination of any asynchronous signal is possible in a system which, due to the operating cycle, is fully synchronous under production conditions. This is required since the internal delay time of the semiconductor circuit to be determined is arbitrary, which means that it does not necessarily occur in a synchronous way relative to the operating cycle of the integrated semiconductor circuit.

A further advantage of the present invention is that the automatic determination of the internal delay time of integrated semiconductor circuits is also facilitated in the case of a parallel testing of a plurality of integrated semiconductor chips, since the data measured is filed in different regions of the error memory of the semiconductor tester and the data can be evaluated after completing the test, if several chips are simultaneously tested under production conditions.

According to a further aspect of the present invention a variation of the length of the input test pulse can additionally be detected by a circuit under test. Thus a input test signal is for example fed into the circuit under test, the input test signal having a test signal pulse with a predetermined length, this pulse for example being defined by a first rising an a second falling signal edge (or vice versa). The output signal is then sampled at the output of the circuit under test, this signal being a response to the test signal pulse of the input test signal.

The sampling occurs at predetermined times to obtain a sequence of sample values, wherein, as in the first embodiment, a first state is associated to a sample value when the output signal has a first signal value and a second state is associated to a sample value when the output signal has a second signal value. In the following the number of sample values to which an equal state is associated is counted, i.e. the sample values corresponding to the output signal pulse of the circuit under test are counted. With the help of this number of sample values the length of the output signal of the circuit under test can be determined knowing the respective time interval between the predetermined sampling times. The intervals between the predetermined sampling times can differ.

The inventive device for examining a variation of the length of an input test pulse by a circuit under test makes it possible that, for example, by a comparison of the length of the output signal pulse determined and the length of an input test pulse by the circuit under test signal variations caused can be determined.

In this embodiment of the present invention it is also especially advantageous that a so-called semiconductor tester provided for a functional testing of the integrated circuit can be used. Thus the examination of the signal performance can be automatically performed with a plurality of circuits by simply counting the fail and pass information stored in the error memory of the semiconductor tester.

BRIEF DESCRIPTION OF THE DRAWINGS

Preferred embodiments of the present invention are subsequently detailed referring to the accompanied drawings, in which.

DETAILED DESCRIPTION OF PREFERRED EMBODIMENTS

In the following, the inventive concept for detecting a delay time of a circuit, especially of an integrated semiconductor circuit, is detailed to be able to automatically determine the velocity of logic circuits.

Figure 1:
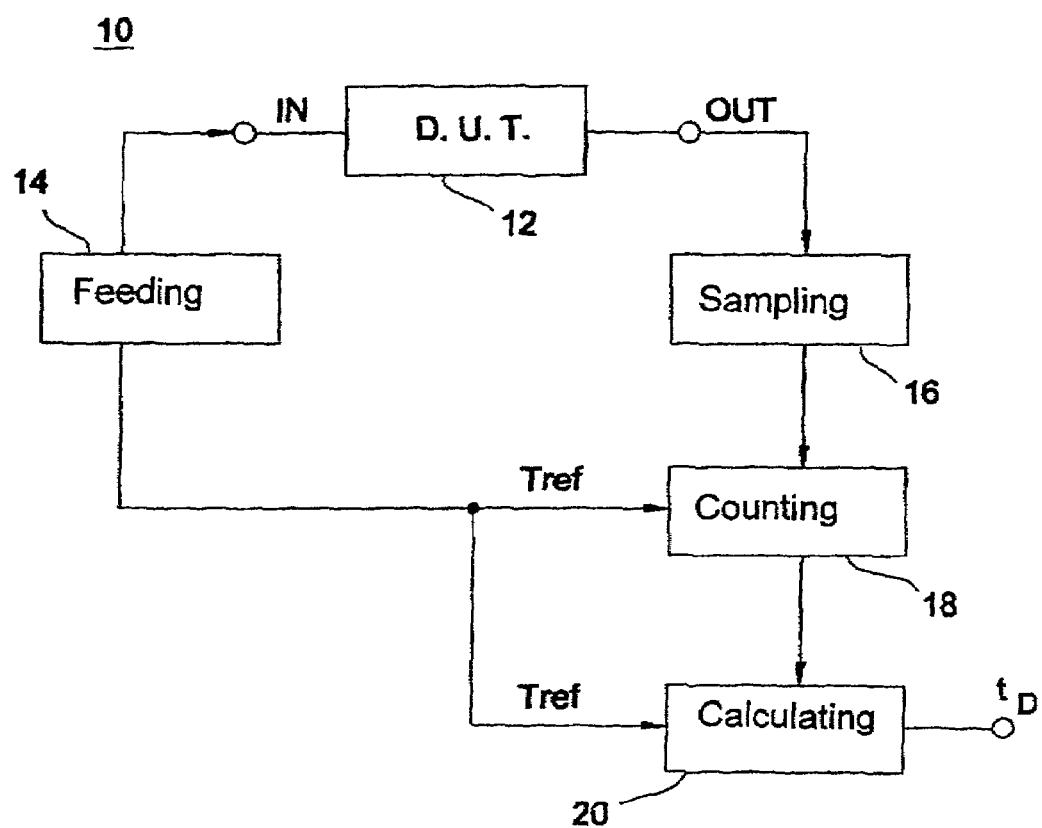
FIG. 1 shows a device for detecting a delay time of a circuit according to a first embodiment of the present invention.

In FIG. 1 a device 10 for detecting a delay time $t_D$ of a circuit under test 12 (DUT; DUT=device under test) is illustrated in principle. Thus the delay time subsequently called $t_{D1}$ represents the relatively long delay time of a slow chip, while the delay time subsequently called $t_{D2}$ represents the relatively short delay time of a fast chip. The device 10 comprises feeding means 14 to feed a test signal into the circuit under test 12 at the input side. The circuit under test 12 is connected to sampling means 16 at the output side, this means sampling the output signal of the circuit under test 12 at predetermined times $T_1, T_2, \ldots T_N$ to obtain a sequence of sample values therefrom. The output of sampling means 16, at which the sequence of sample values is provided, is connected to counting means 18 performing a counting of a predetermined sequence of sample values. The counting of the sample values is thus related to a predetermined reference time $T_{ref}$ provided by means 14 for feeding the test signal. The output of counting means 18 is connected to calculating means 20 calculating the delay time $t_D$ of the circuit under test 12 from the number of sample values counted and using the reference time $T_{ref}$ provided by means 14 for feeding the test signal. The delay time $t_D$ calculated is then provided at the output of calculating means 20.

In the inventive device 10 for detecting a delay time of a circuit 12 a test vector file, i.e. a long sequence of "0" values and "1" values also called pattern or logic pattern, is at first read into the circuit under test 12 (preferably into an integrated semiconductor circuit). This is typically performed by means of so-called input pins, pins for this being typically provided at the circuit 12. This pattern is processed in the circuit 12 while the pattern for example switches through a delay path. Thus a signal propagates on the delay path, the rising an falling times of which are exactly known, since they are predetermined and controlled by the pattern. The output or response signal to be detected then arrives at an output pin of the circuit 12 after the internal delay time $t_D$ to be determined, being a measure of the velocity of the circuit 12. The delay time $t_D$ of the circuit 12 to be determined in this case can take any value, since the delay time is not necessarily synchronous to the operating cycle of the circuit 12.

Figure 2:
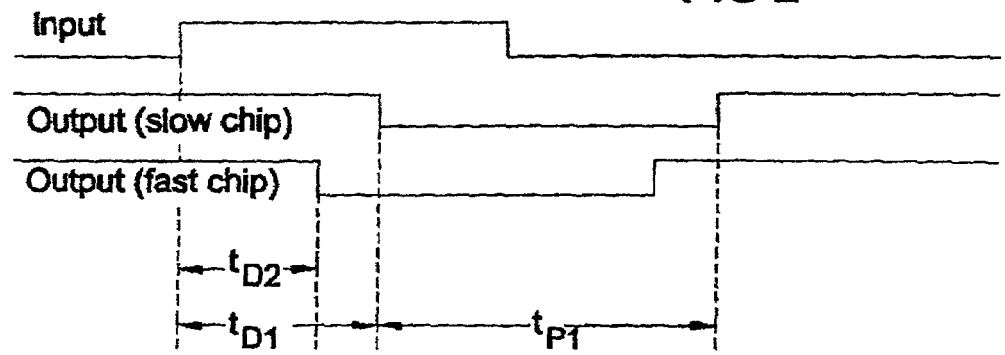
FIG. 2 shows a comparison of the waveforms of a predetermined test signal and an output signal of a "slow" circuit and a "fast" circuit.

In FIG. 2 a waveform of an input signal input into the circuit under test 12 is illustrated. In addition an output signal of a "slow" circuit with a relatively long internal delay time $t_{D1}$ and an output signal of a "fast" circuit with a relatively short internal delay time $t_{D2}$ are shown. The delay times $t_{D1}$, $t_{D2}$ thus give the time delay between a predetermined edge of the input signal and the corresponding edge of the output signal of the slow or the fast circuit 12, respectively.

Figure 3A:
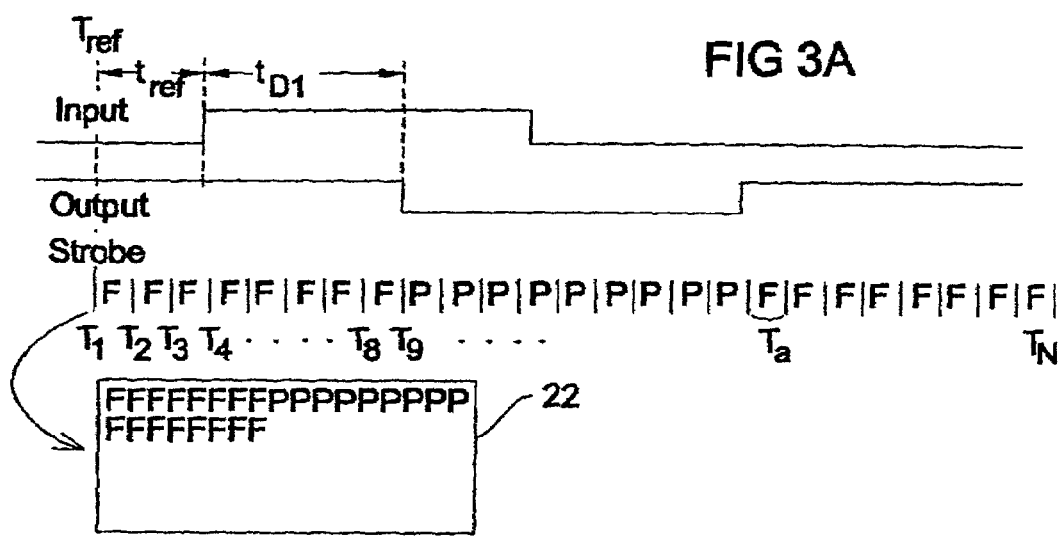
FIGS. 3a–3b show the concept for detecting a delay time of a circuit according to the first embodiment of the present invention.
Figure 3B:
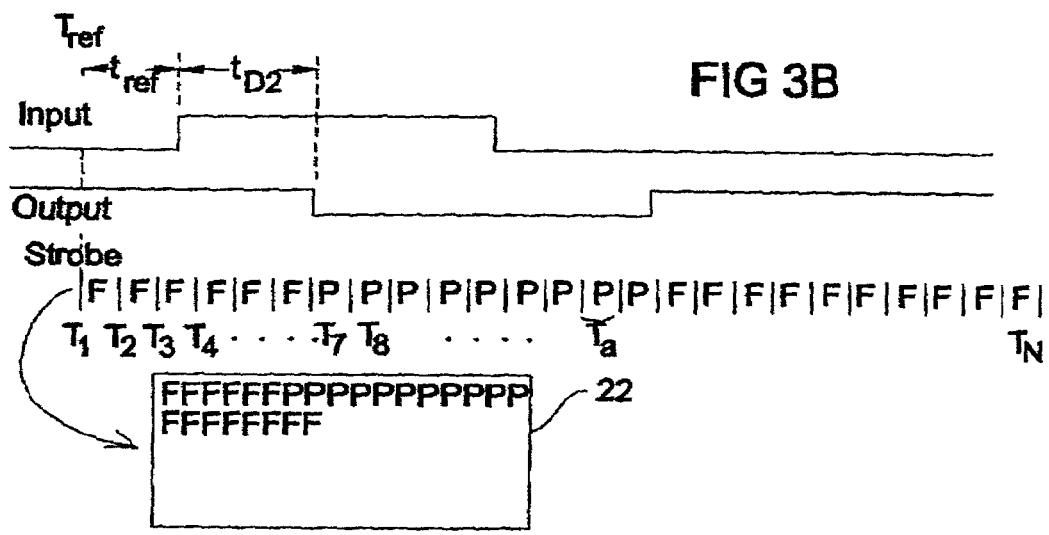

In the following it is shown referring to FIGS. 3a and 3b how these internal circuit delay times $t_{D1}$, $t_{D2}$ are calculated according to the present invention. The circuit-internal delay time is caused by the signal propagation time over the predetermined number of gates in the respective circuit. FIG. 3a thus shows the detection of a relatively large delay time $t_{D1}$ of a "slow" circuit, FIG. 3b showing the detection of a relatively short delay time $t_{D2}$ of a "fast" circuit.

In FIG. 3a the input signal (input) into the circuit 12, the output signal (output) from the circuit 12 and a sample signal (strobe) are illustrated. The input signal is fed into the circuit 12 as the test signal, this signal having at least a predetermined signal edge, the occurrence of which is related to a reference time $T_{ref}$, i.e. the time interval $t_{ref}$ between the reference time $T_{ref}$ and the signal edge of the test signal is predetermined and known. As a response to the input signal an output signal is received at the output of the circuit 12, the signal edge of which is delayed by the internal delay time $T_{D1}$.

The output signal is sampled at predetermined times $T_1, T_2, \ldots T_N$. The predetermined times are provided by a so-called sample signal (strobe) occurring in a predetermined periodic interval $t_a$ so that the interval between the individual predetermined times $T_1, T_2, \ldots T_N$ is known. As a result of the sampling procedure a sequence of sample values F, P is obtained, a first state F being associated to a sample value when the output signal e.g. has a logically high signal value and a second state P being associated to the sample value when the output signal has a logically low signal value. These determined signal values can e.g. be written to an external memory 22, such as an error memory of a semiconductor tester, as "fail" and "pass" signal values F, P. The result thereof is a sequence of F and P signal values in the error memory (also called catch RAM or AFM, respectively) of the semiconductor tester.

In the following it is illustrated how the circuit-internal delay time $t_D$ of the circuit under test 12 is determined from the sampled signal values of the output signal.

In order to be able to determine the circuit-internal delay time it is required to establish a so-called reference time $T_{ref}$ to determine a duration starting from the reference time $T_{ref}$, the duration corresponding to the circuit-internal delay duration $t_D$ or being derived therefrom. In the present case illustrated in FIG. 3a the reference time $T_{ref}$ coincides with the first predetermined time $T_1$.

The reference time $T_{ref}$ however, can for example also be related to a predetermined time coinciding with the occurrence of the predetermined signal edge of the clock signal. When no coinciding of the signal edge of the clock signal and a predetermined time $T_1, T_2, \ldots T_N$ occurs, the reference time $T_{ref}$ can be related to the predetermined time $T_4$ immediately following the occurrence of the signal edge of the test signal. It is also possible that the reference time is related to one of the predetermined times $T_1$–$T_3$ preceding the occurrence of the signal edge of the test signal or preceding directly. For the present invention, however, it is not essential how the actual reference time $T_{ref}$ is selected in a respective case, but it is only required to know the time interval $t_{ref}$ of the reference time $T_{ref}$ and the signal edge of the test signal.

Taken the established reference time $T_{ref}$ into account, the output signal of the circuit 12, as has been described above, is then sampled at the predetermined times $T_1, T_2, \ldots T_N$ to obtain the sequence of sample values F, P, wherein, as is exemplary illustrated in the present case, the first state F is associated to the sample values as long as the output signal of the circuit is for example at a logically high level at the predetermined times $T_1, T_2, \ldots T_N$ and the second state P is associated to the sample values as soon as the signal value of the output signal, after the occurrence of the signal edge, is e.g. at a logically low level.

Depending on whether the circuit under test is "low active" or "high active", i.e. output an outputs signal as a response to the input signal, the output signal comprising a logically low or high level in the active state, the first state F can of course alternatively be associated to the sample values as long as the output signal of the circuit is at a logically low level at predetermined times $T_1, T_2, \ldots T_N$, the second state P then being associated to the sample values as soon as the signal value of the output signal after the occurrence of a signal edge, is at a logically high level.

In the present case illustrated in FIG. 3a the relevant signal edge of the output signal occurs in the region between the predetermined sampling times $T_8$ and $T_9$ of the sample signal, the first state F being associated to this region between $T_8$ and $T_9$. In general the first state F which has also been associated to the preceding sample values is associated to the region between two sampling times, in which the relevant signal edge of the output signal falls. It is, however, also feasible to associate the second state P to this region when this is consistent with the required measuring accuracy for the internal circuit delay time $t_{D1}$ to be determined. If the relevant signal edge of the output signal coincides with a predetermined sampling time, the first state F will generally be associated to the region before this sampling time and the second state P will be associated to the region following this sampling time.

As has already been discussed, the sequence of sample values with the associated states F, P can be stored in an external memory 22, this external memory preferably being the error memory of a semiconductor tester used for the circuit test. Thus the error memory values "fail" or "pass" of the semiconductor tester are preferably associated to the sample values.

Then the number of sample values can be determined by counting the sequence of sample values to which for example the first state value F is associated, taking account of the selected and predetermined reference point $T_{ref}$. This number is a measure of the duration between the reference time $T_{ref}$ and basically the signal edge of the test signal. Since a predetermined duration $t_a$ which can differ from one sample value to the next is associated to each sample value, the circuit-internal delay time $t_D$ of the circuit under test thus can be determined using the number of sample values and, if the predetermined durations differ, using the sum of the individual predetermined durations until a pass/fail change of state and from the knowledge of the reference time $T_{ref}$.

As has already been discussed, the internal delay time obtained is a measure of the velocity of the integrated semiconductor circuit tested.

With the present invention the circuit-internal delay time of a plurality of circuits, especially of integrated semiconductor circuits, can be detected in parallel. This means that the automatic determination of the internal delay time is also facilitated in the case of a parallel testing of a plurality of circuits, since the data measured, i.e. the sequence of sample values F, P, can be filed in different regions of the error memory of the semiconductor tester and, after concluding the test, evaluated as to different criteria, if several integrated semiconductor circuits are to be tested under production conditions. Thus a statistical distribution of the delay times of a large number of integrated semiconductor circuits can for example be calculated.

In practice typical delay times for integrated semiconductor circuits are for example between some 10 ns for "fast circuits" and some 100 ns for "slow circuits", so that with presently used semiconductor testers the detection discussed above is easily possible in the internal circuit delay time.

In the case of a constant time interval between the predetermined times it is required for a practical solution of the circuit-internal delay time $t_D$ to set the interval $t_a$ of the predetermined times $T_1, T_2, \ldots T_N$ in such a way that the delay of the circuit equals at least double the time interval $t_a$ between two predetermined times $T_1, T_2, \ldots T_N$.

For non-equidistant times only the edge expected is resolved with a high number of strobes, while where no edge is expected larger intervals $t_a$ are used to save data.

If a minimal circuit-internal delay time of about 10 ns is considered, the time interval $t_a$ between two predetermined times should be set to a value smaller than or equal to 5 ns and preferably to a value smaller than or equal to 1 ns, the respective setting of the sampling time interval $t_a$ selected in the individual case being dependent on the demands posed regarding the accuracy of the detection of the internal circuit delay time $t_D$.

In the present invention it is especially advantageous that a so-called semiconductor tester provided for a functional testing of the integrated semiconductor circuit can be used to calculate the delay time of the circuit, the sequence of fail and pass information being saved in the error memory of the semiconductor tester, which, depending on the frequency of the sample signal, represents the circuit-internal delay time of the signal. With the present invention thus the determination of the internal delay time of a plurality of circuits can be performed automatically by simply counting the fail and pass information stored in the error memory of the semiconductor tester.

Thus data on the distribution of the internal delay time and thus the velocity of a plurality of integrated semiconductor circuits can be acquired automatically, wherein these data can be evaluated statistically so that statements on process variations and their effects on the electric performance of the integrated semiconductor circuit can also be made therefrom. With the help of the data acquired the existing circuit simulation models can then be refined so that in the future the velocity variations due to technical process variations can be predicted better and thus better be included in the circuit simulation.

In the following the inventive concept for determining a variation of the length of an input test pulse by a circuit under test, especially by an integrated semiconductor circuit, will be discussed in detail. Thus the signal performance of logic circuits can for example be determined automatically.

Figure 4:
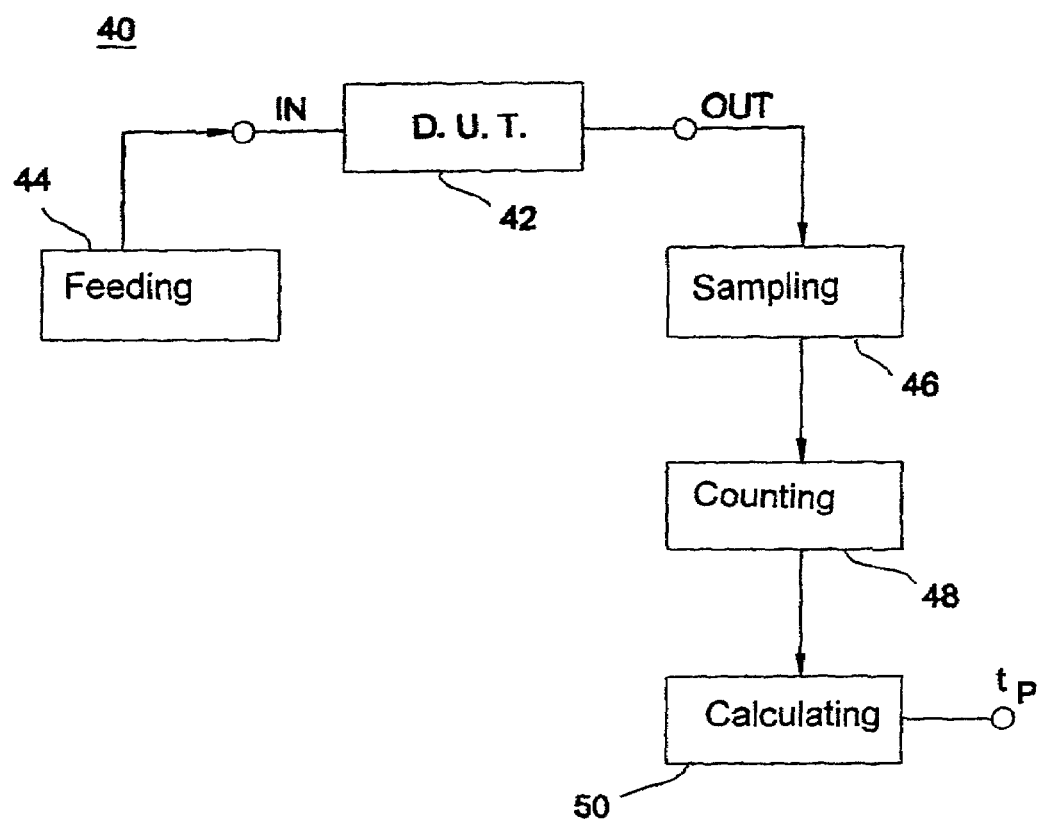
FIG. 4 shows a device for determining a variation of the length of an input pulse by a circuit under test according to a further embodiment of the present invention.

In the following reference is made to FIG. 4 representing a device for determining a variation of the length of an input test pulse by a circuit under test.

The device 40 comprises feeding means 44 to feed a test signal (IN) into the circuit under test 42 at the input side. The circuit under test 42 is, on the output side, connected to sampling means 46 sampling the output signal (OUT) of the circuit under test 42 at predetermined times $T_1, T_2, \ldots T_N$ to obtain a sequence of sample values therefrom. The output of sampling means 46, at which the sequence of sample values is provided, is connected to counting means 48 performing a counting of a predetermined sequence of sample values. The output of counting means 48 is connected to calculating means 50 calculating the length $t_p$ of the output pulse of the output signal of the circuit under test from the number of counted sample values. The calculated length $t_p$ of the output pulse is then provided at the output of calculating means 50.

As in the first embodiment of the present invention a test vector file (pattern) is also read into the circuit under test 42. This pattern is processed in the circuit 42, wherein the pattern for example switches through a circuit path. A signal, the rising and falling times of which are exactly known, thus propagating on the circuit path. The output or response signal to be detected, respectively, then arrives at the output of the circuit under test 42. Due to the signal performance of the circuit under test 42 the length of the output pulse may have varied compared to the length of the input test pulse. The variation of the length of the output pulse relative to the length of the input test pulse is for example caused by the signal propagation time over a predetermined number of gates in the respective circuit under test. Thus a shortening or lengthening, respectively, of the output pulse relative to the length of the input test pulse may result.

In the following it is explained how these signal variations of the circuit under test 42 are calculated. The input test pulse thus generally comprises a first and a second signal edge, an output pulse being output as a response to the test signal pulse of the input test signal at the output of the circuit under test 42, this pulse in turn comprising a first and a second output signal edge. Thus it should be noted that the circuit under test 42 may be "low active" or "high active". In means 46 for sampling the output signal for the circuit under test 42 the output signal is then sampled at predetermined times to obtain, as has already been explained in the first embodiment, the sequence of sample values. Thus a first state "fail" is associated to a sample value when the output signal has a first signal value (e.g. high), a second state "pass" being associated to a sample value when the output signal has a second signal value (e.g. low). These determined signal values can for example be written to an external memory, such as an error memory of a semiconductor tester, as "fail" and "pass" signal values F, P, respectively. The result is a sequence of F and P signal values in the error memory of the semiconductor tester.

By counting the sequence of sample values, to which a first state value F is for example associated and which represents the output pulse of the output signal, the number of sample values can be determined. This number of sample values is a measure of the duration between the first and the second output signal edge of the output signal, i.e. of the length of the output pulse. Since a predetermined duration is associated to each sample value, wherein this duration can differ from one sample value to the next, the length $t_p$ of the output pulse of the output signal, as is for example shown in FIG. 2 (reference numeral $t_{p1}$), can be determined using the number of sample values and, if the predetermined durations differ, using the sum of the individual predetermined durations.

In the case of a constant interval between the predetermined times the length of the output pulse is determined by simply counting the sample values, wherein it is required for a practical and adequate solution of the length of the output pulse of the circuit under test to set the interval of the predetermined times at suitable values.

In the case of non-equidistant intervals between the predetermined sampling times the length $t_p$ of the output pulse of the output signal is determined using the sum of the individual predetermined durations. This procedure is for example selected to resolve the edges expected, i.e. the first and second signal edges of the output signal, with a high number of sample values, while where no edge is expected larger intervals between the sampling times can be used to save data.

As in the preceding embodiment of the present invention it is especially advantageous that in this case, too, a so-called semiconductor tester, such as a logic tester or a memory tester, provided for a functional testing of integrated semiconductor circuits can be used. Thus, for determining the length of the output signal pulse, the sequence of sample values of the output signal obtained by sampling is filed in the error memory of the semiconductor tester as a sequence of so-called "fail" and "pass" information. The result is a sequence of F and P information in the error memory, the sequence representing the length of the output signal pulse possibly varied relative to the input test pulse. Thus by simply counting the information stored in the error memory and using the known time intervals between the sampling times the length of the output pulse of the circuit under test can be calculated. Since in this arrangement only the length of the output pulse occurring as a response to the test input pulse of the test signal is to be determined, it is not required to predetermine a certain reference time for determining the length of the output pulse.

A further aspect of the present invention could for example be to combine the functioning of both embodiments of the present invention so that, on the one hand, the delay time of the circuit under test relative to the test signal can be determined and, in addition, a variation of the length of an output pulse of the circuit under test as a response to the input test pulse can be determined.

The invention claimed is:

1. A device for detecting a delay time of a circuit, comprising:
    a feeder for feeding a test signal into the circuit, said test signal including a signal edge, the occurrence of which is related to a reference time;
    a sampler for sampling an output signal of the circuit at predetermined times to obtain a sequence of sample values, each sample value having an associated time duration equal to a time interval between adjacent predetermined times, a first state being associated with a sample value when said output signal has a first signal value and a second state being associated with a sample value when said output signal has a second signal value;
    a counter for counting said sample values of said sequence, to which an equal state is associated, starting from said reference time or from another reference time, the time interval of which to said reference time being known, to obtain counted sample values; and
    a calculator for calculating the delay time, said calculator calculating the delay time using at least one of:
        (a) a sum of the predetermined time durations associated with the counted sample values,
        (b) a sum of the predetermined time durations associated with the counted sample values and the another reference time, and
        (c) a sum of the predetermined time durations associated with the counted sample values and the time interval.

2. The device according to claim 1, in which said predetermined times are selected in such a way that the delay of said circuit equals at least double the time interval between two predetermined times.

3. The device according to claim 1, in which said predetermined times occur in a predetermined periodic interval to one another.

4. The device according to claim 1, in which said predetermined times are provided by an arbitrarily timed strobe signal.

5. The device according to claim 1, in which said reference time is in the vicinity of the signal edge of said test signal.

6. The device according to claim 1, in which said reference time is related to a predetermined time coinciding with the occurrence of the signal edge of said test signal.

7. The device according to claim 1, in which said reference time is related to a predetermined time directly following the occurrence of the signal edge of said test signal.

8. The device according to claim 1, in which said reference time is related to a predetermined time preceding the occurrence of the signal edge of said test signal.

9. The device according to claim 1, in which said delay times of a plurality of circuits are detected simultaneously.

10. The device according to claim 9, in which a statistical distribution of said delay times of said plurality of circuits is determined.

11. The device according to claim 1, in which said circuit is an integrated semiconductor circuit.

12. The device according to claim 1, in which said sequence of sample values is stored in an external memory.

13. The device according to claim 12, in which said external memory is an error memory of a semiconductor tester.

14. The device according to claim 12, in which said external memory is an error memory of a logic tester.

15. The device according to claim 12, in which said external memory is an error memory of a memory tester.

16. The device according to claim 12, in which the first state of a sample value is a fail state and the second state of a sample value is a pass state in said external memory or vice versa.

17. A method of detecting a delay time of a circuit, comprising:
feeding a test signal into the circuit, the test signal including a signal edge, the occurrence of which is related to a reference time;
sampling an output signal of the circuit at predetermined times to obtain a sequence of sample values, each sample value having an associated time duration equal to a time interval between adjacent predetermined times, a first state being associated to a sample value when the output signal has a first signal value and a second state being associated to a sample value when the output signal has a second signal value; counting the sample values of the sequence; to which an equal state is associated, starting from the reference time or from another reference time, the time interval of which to the reference time being known, to obtain counted sample values; and
calculating the delay time using at least one of:
(a) a sum of the predetermined time durations associated with the counted sample values and the reference time,
(b) a sum of the predetermined time durations associated with the counted sample values and the another reference time, and
(c) a sum of the predetermined time durations associated with the counted sample values and the time interval.

18. The method according to claim 17, in which said predetermined times are selected in such a way that the delay of said circuit equals at least double the time interval between two predetermined times when said intervals are equidistant.

19. The method according to claim 17, in which said predetermined times occur in a predefined periodic or non-periodic interval to one another.

20. The method according to claim 17, in which said predetermined times are provided by an arbitrarily timed strobe signal.

21. The method according to claim 17, in which said reference time is in the vicinity of the signal edge of said test signal.

22. The method according to claim 17, in which said reference time is related to a predetermined time coinciding with the occurrence of the signal edge of said test signal.

23. The method according to claim 17, in which said reference time is related to a predetermined time directly following the occurrence of the signal edge of said test signal.

24. The method according to claim 17, in which said reference time is related to a predetermined time preceding the occurrence of the signal edge of said test signal.

25. The method according to claim 17, in which said delay times of a plurality of circuits are detected.

26. The method according to claim 25, in which a statistical distribution of said delay times of said plurality of circuits is determined.

27. The method according to claim 17, in which said circuit is an integrated semiconductor circuit.

28. The method according to claim 17, in which said sequence of simple values is stored in an external memory.

29. The method according to claim 28, in which said external memory is an error memory of a semiconductor tester.

30. The method according to claim 28, in which said external memory is an error memory of a logic tester.

31. The method according to claim 28, in which said external memory is an error memory of a memory tester.

32. The method according to claim 28, in which the first state of a sample value is a fail state and the second state of a sample value is a pass state in said external memory or vice versa.

33. A device for determining a variation of the length of an input test pulse by a circuit under test, comprising:
a feeder F or feeding the input test signal into the circuit, the input test signal including at least a first and a second test signal edge, said first and second test signal edges defining the predetermined length of an input teat pulse of the input test signal;
a sampler for sampling an output signal of the circuit, said signal including a first and a second output signal edge, said first and second output signal edges of said output signal defining the length of an output pulse of said output signal as a response to said input test pulse of said test signal, the sampling occurring at predetermined times to obtain a sequence of sample values, each sample value having an associated time duration equal to a time interval between adjacent predetermined times, a first state being associated with a sample value when said output signal has a first signal value and a second state being associated with a sample value when said output signal has a second signal value;

a counter for counting said sample values to which an equal state is associated to obtain counted sample values; and a calculator for calculating the length of said output pulse of said output signal of the circuit using a sum of the predetermined time durations associated with the counted sample values.

34. A method for determining a variation of the length of an input test pulse by a circuit under test, comprising:

feeding the input test signal into the circuit, the input test signal including at least a first and a second test signal edge, the first and second test signal edges defining the predetermined length of an input test pulse of the input test signal;

sampling an output signal of the circuit, the output signal including a first and a second output signal edge, the first and second output signal edges of said output signal defining the length of an output pulse of the output signal as a response to the input test pulse of the input test signal, the sampling occurring at predetermined times to obtain a sequence of sample values, each sample value having an associated time duration equal to a time interval between adjacent predetermined times, a first state being associated with a sample value when the output signal has a first signal value and a second state being associated with a sample value when the output signal has a second signal value;

counting the sample values to which an equal state is associated to obtain a counted number of sample values; and calculating the length of the output pulse of the output signal of the circuit using a sum of the predetermined time durations associated with the counted sample values.

35. A device for detecting a delay time of a circuit, comprising:

a feeder for feeding a test signal into the circuit, said test signal including a signal edge, the occurrence of which is related to a reference time;

a sampler for sampling an output signal of the circuit at predetermined times to obtain a sequence of sample values, a first state being associated with a sample value when said output signal has a first signal value and a second state being associated with a sample value when said output signal has a second signal value;

a counter for counting said sample values of said sequence, to which an equal state is associated, starting from said reference time or from another reference time, the time interval of which to said reference time being known, to obtain a counted, number of sample values;

a calculator for calculating the delay time using the counted number of sample values and said reference time;

the delay times of a plurality of circuits being detected simultaneously; and a statistical distribution of said delay times of said plurality of Circuits being determined.

36. A method of detecting a delay time of a circuit, comprising:

feeding a test signal into the circuit, the test signal including a signal edge, the occurrence of which is related to a reference time;

sampling an output signal of the circuit at predetermined times to obtain a sequence of sample values, a first state being associated with a sample value when the output signal has a first signal value and a second state being associated with a sample value when the output signal has a second signal value;

counting the sample values of the sequence, to which an equal state is associated, starting from the reference time or from another reference time, the time interval of which to the reference time being known, to obtain a counted number of sample values;

calculating a delay time using the counted number of sample values and the reference time;

detecting the delay times of a plurality of circuits simultaneously; and determining a statistical distribution of the delay times of the plurality of circuits.

* * * * *